United States Patent [19]
Daghighian et al.

[11] Patent Number: 6,037,644
[45] Date of Patent: Mar. 14, 2000

[54] SEMI-TRANSPARENT MONITOR DETECTOR FOR SURFACE EMITTING LIGHT EMITTING DEVICES

[75] Inventors: Henry M. Daghighian, Harrisburg; Michael F. Cina, Elizabethtown, both of Pa.

[73] Assignee: The Whitaker Corporation, Wilmington, Del.

[21] Appl. No.: 08/928,206

[22] Filed: Sep. 12, 1997

[51] Int. Cl.[7] .................................................. H01L 31/00
[52] U.S. Cl. .............................. 257/444; 257/53; 257/54; 257/80; 257/81; 257/82; 257/431; 257/443; 257/449; 257/458; 257/461; 372/50; 372/98
[58] Field of Search ................................. 257/80, 82, 84, 257/85, 53, 54, 79, 81, 431, 433, 443, 444, 449, 451, 458, 461; 372/50, 98

[56] References Cited

U.S. PATENT DOCUMENTS

| | | | |
|---|---|---|---|
| 5,122,852 | 6/1992 | Chan | 257/85 |
| 5,285,466 | 2/1994 | Tabatabaie | 372/50 |
| 5,353,498 | 10/1994 | Fillion et al. | 29/840 |
| 5,475,701 | 12/1995 | Hibbs Brenner | 372/50 |
| 5,491,712 | 2/1996 | Lin et al. | 372/50 |
| 5,574,744 | 11/1996 | Gaw et al. | 372/50 |
| 5,606,572 | 2/1997 | Swirhun et al. | 372/96 |
| 5,742,630 | 4/1998 | Jiang et al. | 327/50 |
| 5,751,757 | 5/1998 | Jiang et al. | 372/50 |
| 5,757,829 | 5/1998 | Jiang et al. | 372/31 |
| 5,801,402 | 9/1998 | Shin | 257/80 |
| 5,812,582 | 9/1998 | Gilliland et al. | 372/50 |
| 5,903,016 | 5/1999 | Whitney | 257/84 |

FOREIGN PATENT DOCUMENTS

| | | | |
|---|---|---|---|
| 0 354 853 | 2/1990 | European Pat. Off. | H01L 31/28 |
| 0 356 190 | 2/1990 | European Pat. Off. | G02B 6/12 |
| 58-169981 | 10/1983 | Japan | 257/82 |
| 1-184964 | 7/1989 | Japan | 257/82 |
| WO 95/26051 | 9/1995 | WIPO | H01L 31/14 |

OTHER PUBLICATIONS

Sze, Physics of Semiconductor Devices, 2nd ed. 1981 p. 749.

Hasnain, et al. Monolithic Integration of Photodetector with VCSEL, Electronic Letters, vol. 27, No. 18, Aug. 29, 1991.

Patent Abstracts of Japan, vol. 010, No. 289 (E–442), Oct. 2, 1986 & JP 61 108186 A (Seiko Epson Corp.), May 26, 1986.

Patent Abstracts of Japan, vol. 012, No. 304 (E–646), Aug. 18, 1988 & JP 63 073687 A (Mitsubishi Electric Corp), Apr. 4, 1988.

Patent Abstracts of Japan, vol. 097, No. 011, Nov. 28, 1997 & JP 09 199795 A (Matsushita Electric Ind Co. Ltd), Jul. 31, 1997.

Patent Abstracts of Japan, vol. 095, No. 008, Sep. 29, 1995 & JP 07 135487 A (Hitachi Ltd; Others: 01), May 23, 1995.

International Search Report, Applicant's file reference 17074 PCT, International Application No. PCT US/98/18591, International filing date, Apr. 9, 1998.

D.E. Carlson, "*Amorphous Silicon Solar Cells*," IEEE Trans. Electron Devices, ED–24, 449 (1977).

*Physics of Semiconductor Devices*, by S. M. Sze p. 828 & 829.

*Primary Examiner*—Jerome Jackson, Jr.
*Assistant Examiner*—Bradley William Baumeister

[57] ABSTRACT

A structure for providing direct feedback of power emitted by a surface emitting light emitting device and the subsequent optical power control of the device is disclosed. In a preferred embodiment, an array of vertical cavity surface emitting lasers emit light having a wavelength which is partially detected by an array of photodetectors. The semi-transparent photodetectors array has an absorption coefficient which is relatively small at the wavelength of light emitted by the lasers. Most of the emitted light will be transmitted through the detectors while a small insignificant fraction in magnitude is absorbed and converted to photocurrent for monitoring the output power of the devices. The structure of the device of the present disclosure is simple, readily fabricated through uncomplicated techniques and of materials which do not effect the beam characteristics of the surface emitting devices.

15 Claims, 3 Drawing Sheets

SEMI-TRANSPARENT MONITOR DETECTOR FOR SURFACE EMITTING LIGHT EMITTING DEVICES

BACKGROUND OF THE INVENTION

The present invention relates to a semi-transparent monitor detector structure for monitoring the emission of surface emitting light emitting devices, preferably vertical cavity surface emitting lasers (VCSEL). Surface emitting light emitting devices, to include surface emitting lasers, have many advantages over conventional edge emitting devices. These advantages includes less complicated manufacturing processes, single mode as well as multimode operation higher coupling efficiencies and overall lower cost. Vertical cavity surface emitting lasers (VCSEL) are one promising surface emitting device which can be used in a variety of communication systems. Like other lasers used in fiber optic communications, a feedback circuit is desired to assure a near constant output power from the laser be maintained. To this end, during operation, ambient temperature changes and aging of the device can result in fluctuations in the output power of the laser. In order to provide proper feedback to assure a near constant output, some of the light emitted from the laser must be directed to a photo detector. The output of the photo detector is transmitted to a control circuit which adjusts the driver circuitry and thus the current to the laser until the desired output power is regained.

In edge emitting devices, the rear facet of the edge emitting laser diode allows for monitoring of the optical power emitted from the front facet of the laser diode to assure that necessary adjustments to the injected current to the laser be maintained for constant output power. This type of monitoring of an edge emitting device through the rear facet of the laser diode is a very efficient means by which monitoring is accomplished, as this type of monitoring does not interfere with the output of the laser diodes front facet. Again, a feedback control circuit is used to detect any changes in the optical power of the front facet of the laser diode and controls the transmitter driver circuit to adjust the laser diodes drive conditions such that the optical power is kept at a constant desired level. Unfortunately, in vertical cavity surface emitting devices, there is no rear facet only a rear mirror structure which will not normally allow much light to pass.

The advantages of vertical cavity surface emitting lasers has led to some solutions for monitoring the power output from a surface emitting laser. To this end, U.S. Pat. No. 5,491,712 to Lin et al. as well as U.S. Pat. No. 5,475,701 to Hibbs-Brenner, the disclosures of which are specifically incorporated herein by reference, teach various ways to monitor the output of a VCSEL. The reference to Hibbs-Brenner monitors light output from the backside of the device, which is normally the 10–20% of the total light output of the device. This 10–20% portion of the light emitted from the backside is normally not coupled to any waveguides and is therefore lost. The device disclosed in the reference to Hibbs-Brenner is an AlGaAs/GaAs vertical cavity surface emitting laser which has a photodiode made of similar III–V materials fabricated beneath the multiquantum well structure of the laser. This is a rather complicated structure, and requires a rather complicated photodetector, generally a PIN structure. Another drawback to the device of the Hibbs-Brenner structure in addition to being complex to manufacture, and thereby costly, this structure also requires that the photodetector is biased to monitor the detected light output. Additionally, in array form, the integral detector structure has to be formed for each channel which can be a costly processing step, and a potentially yield issue. If one feature of the integrated device fails the whole array is rejected. The uniformity in performance and reliability of the integrated structures of the prior art devices are not clearly understood. The integrated structure does not necessarily guarantee detection and monitoring of the different mode field emissions from the VCSEL and therefore can not give a direct feedback on the power of the beam launched into the fiber. The multimode nature of the VCSEL are essential for data link applications due to "modal noise sensitivity" in data communication links. The integrated detector devices of the references to Hibbs-Brenner and Lin, et al. only detect the field developed inside the cavity. The mode field power inside the cavity is unreliable in part because of the presence of the amount of optical mode field power inside the cavity as a result of spontaneous emission. The spontaneous emission from the cavity is not the desired coupled energy to the fiber for communications, and thus is not an accurate measure of the operating condition of the device. Other methods for monitoring the beam power are reflective and refractive methods by which a detector sees the partial reflection of the VCSEL beam. The multimode nature of the VCSEL does not guarantee the direct monitoring of all the power emitted from the VCSEL. This is because only some of the many different mode field emission pattern from the VCSEL (which vary at different operating conditions) will meet the reflection angle requirement of the reflective optics, and the monitor diode used in this scheme will not be able to sense the combined multimode optical field which is incident on to the fiber or waveguide. In summary, the multimode nature of the VCSEL can result in a variation in mode structure and different power and coupling schemes for optical power coupling into the fiber. What is needed is a structure that gives a better correlation for that purpose.

The patent to Lin et al. sets forth two basic structures for monitoring light output from the vertical cavity device. In one embodiment, a photodiode structure is integrated with the surface emitting laser a current wherein a side absorption photodiode structure is used. This side absorption photodiode structure is integrated with a surface emitting laser, where the side photodiode is formed in the region adjacent to the surface emitting laser. Accordingly, this structure relies on the indirect coupling of light from the laser to the photodiode to assure monitoring. In another embodiment in the '712 reference, a schottky photodiode is located in the optical path of the light emitted from the cavity of the laser. The metal layer used for the schottky barrier is chosen so that the schottky barrier formed between the metal and the semiconductor is less than the photon energy of the light to be emitted. The metal is chosen to be of a thickness so that the light is partially transparent to the emitted light. While less complicated than the photodiode structure discussed above in connection with the '712 reference, this structure also suffers from the problems of the integrated detector and also requires the biasing of the detector. Furthermore, the devices of both of the above incorporated U.S. Patents would be very difficult to produce at large scale manufacturing levels.

What is needed is a less complicated device structure for monitoring the output power of a vertical cavity surface emitting laser, as well as other surface emitting light emitting devices, which insignificantly interferes with the output of the device while providing a reliable monitoring of the light energy actually coupled to the fiber in a scheme which is both easy to manufacture, of low cost, and remaining relatively simple in structure.

SUMMARY OF THE INVENTION

The present invention relates to a structure for providing direct feedback for optical power control of a vertical cavity surface emitting laser array in which a semi-transparent detector is placed in front of the vertical cavity surface emitting laser. The optical signal transmitted through the active elements of the semi-transparent detector are detected and the detected signal is then fed into the driver circuitry using simple trans-impedance amplifiers external or integral to the driver circuitry to provide closed loop feedback control of the optical power. In the preferred embodiment of the present invention, this scheme is deployed in an array structure in which each vertical cavity surface emitting laser has a matching semitransparent detector positioned to monitor its output power. Furthermore, the distance between the VCSEL's of the array and their respective detectors is a maximum distance (set by thickness of glass substrate and assembly process)of about three millimeters to avoid beam divergence problems. In the case of an array VCSEL, an array VCSEL driver circuit is used to drive the lasers with the individually detected signals from the detector array elements fed to the driver circuitry as described above. By using this technique, a direct monitor of the vertical cavity surface emitting laser light power emission in to the fiber or waveguide medium is achieved, and control of the optical power level is maintained at all times. Using the direct monitoring scheme of the present invention, adjustments to the drive conditions on each VCSEL element separately is carried out and accounts for laser performance variations over time and temperature, by adjusting the VCSEL bias current in a closed loop feedback format. The preferred detector structure(amorphous silicon) has no significant aging or reliability problems and it has negligible noise, offset and temperature sensitivity.

The preferred embodiment of the present disclosure has a layer of amorphous silicon having a thickness of a few microns to about ten microns which is formed on a glass substrate through standard deposition techniques and is selectively doped to form PN junctions in the selected areas of the silicon. The PN junctions are unbiased and act an photovoltaic devices. The structure could also be a Schottky based devices with indium tin oxide contacts which are transparent to the wavelengths of interest in the present invention. The amorphous silicon is chosen because the optical absorption spectrum is best at the visible spectrum and extends to the near IR to function in the range of 850 nanometers, the preferred wavelength of the vertical cavity lasers of the invention of the present disclosure. Because the absorption coefficient is very small at this wavelength (reference FIG. 4), most of the light emitted from the laser will be transmitted and a small fraction, is absorbed and converted to photo current for monitoring the output power. The structure of the device of the present disclosure is simple, and is readily fabricated through uncomplicated, and well known fabrication techniques. The material used in this structure does not affect the beam characteristics of the VCSEL and the well defined, beam characteristics of the VCSEL are unchanged as the beam traverses the semitransparent detector. Each of the detectors used for power monitoring does not need to be biased, and therefore does not suffer from dark current problems and the dependence thereof on temperature. The simple detection design also enables additional features to ease optical coupling and eye safe design issues. By applying special anti-reflective coating or other coatings to the glass substrate, beam power attenuation , an essential feature required for eye safety requirements with VCSELs is achievable. An integral lensing solution, holographic or ink jetted for example, can be applied to the detector substrate to achieve enhanced optical coupling or numerical aperture conversion to design an eye safe product. This technology also lends itself to the chip on flex technology and the multilayer stacking technology. In contrast to integrated detectors discussed above where detecting only the field developed in the cavity of the VCSEL, the invention of the present disclosure uses a field power or $E^2$ detector. The present invention uses a power detector with sufficient area to enable the capture of the total power emitted from the VCSEL and therefore gives a better correlation to the field coupled to the VCSEL.

The invention of the present disclosure can be used for two dimensional arrays as well as single element and linear arrays.

OBJECTS, FEATURES AND ADVANTAGES OF THE PRESENT INVENTION

It is an object of the present invention to have a structure for reliably monitoring the light output power from surface emitting light emitting devices to include vertical cavity surface emitting lasers.

It is a feature of the present invention to have unbiased semiconductor P/N, PIN or Schottky junction devices which are semi-transparent to light of the wavelength emitted by the surface emitting device.

It is an advantage of the present invention that through a relatively simple structure, and ease in incorporation into existing fiber optic packaging approaches, that monitoring of the output power of the surface emitting devices is effected in a nonobstructive manner to the performance of the surface emitting devices.

DETAILED DESCRIPTION OF THE INVENTION

As stated earlier, by virtue of the present invention direct feedback for the optical power output and control thereof of a VCSEL array is the preferred embodiment of the present disclosure, and is effected by the use of a semi-transparent detector array which matches the VCSEL array in geometry. The detector array is placed in front of the VCSEL array. Alternatively, in another embodiment, it is possible to monitor a single surface emitting device in substantially the same manner as is effected in an array. The optical signal transmitted through the active elements of the semi-transparent detector array are detected individually by the detector array elements. This detected signal is fed back into a vertical cavity surface emitting laser array driver circuit for closed loop feed-back control of the optical power. By virtue of this method, direct monitoring of the transmitted beam and control of the optical power is effected at all times. Using the direct beam monitoring scheme, the bias point of the VCSEL can be adjusted on each vertical cavity surface emitting laser element separately and account for VCSEL performance variations over time and temperature as is well known to one of ordinary skill in the art.

Figure 1:
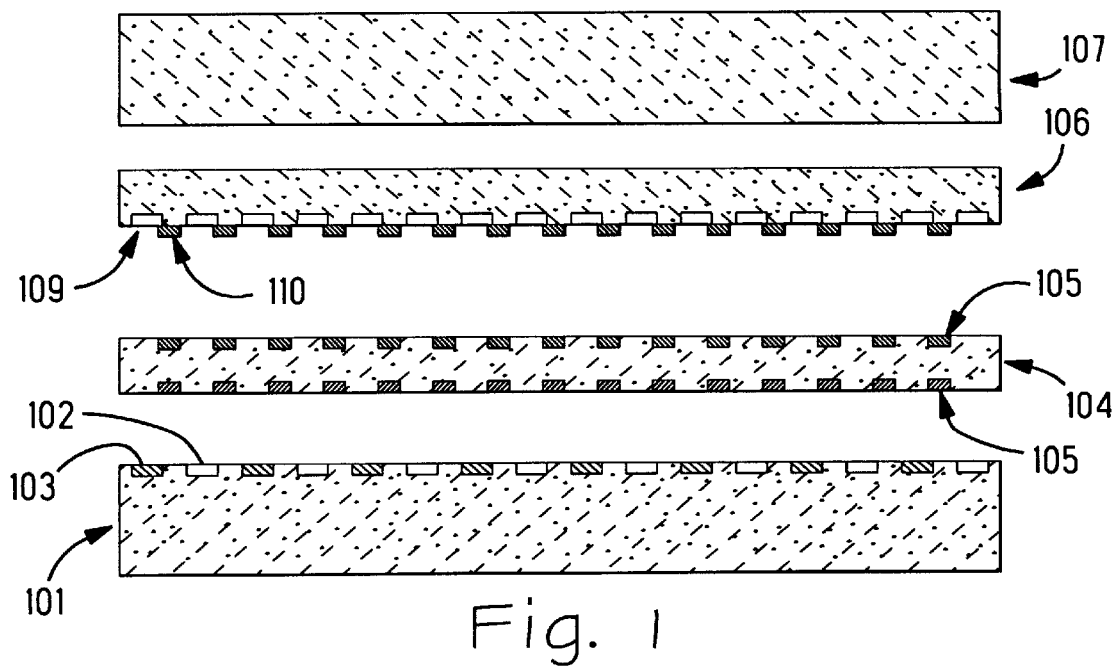
FIG. 1 shows a cross sectional view of the device of the present disclosure.
Figure 2A:
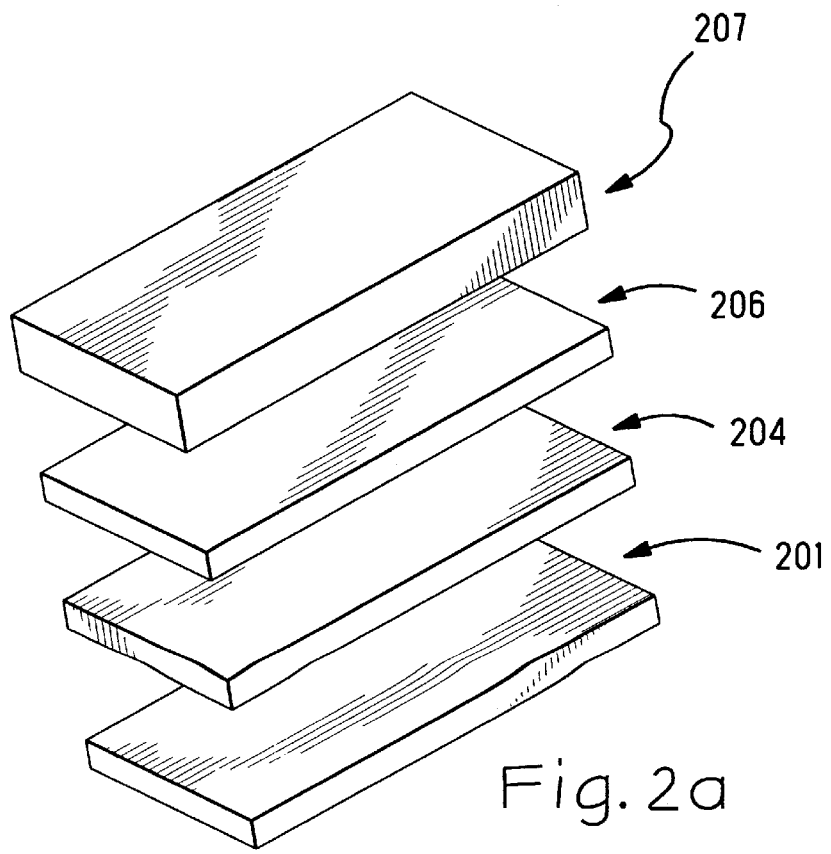
FIG. 2 shows an exploded view of the embodiment in which an array of VCSEL'S is monitored by an array of detectors.
Figure 2B:
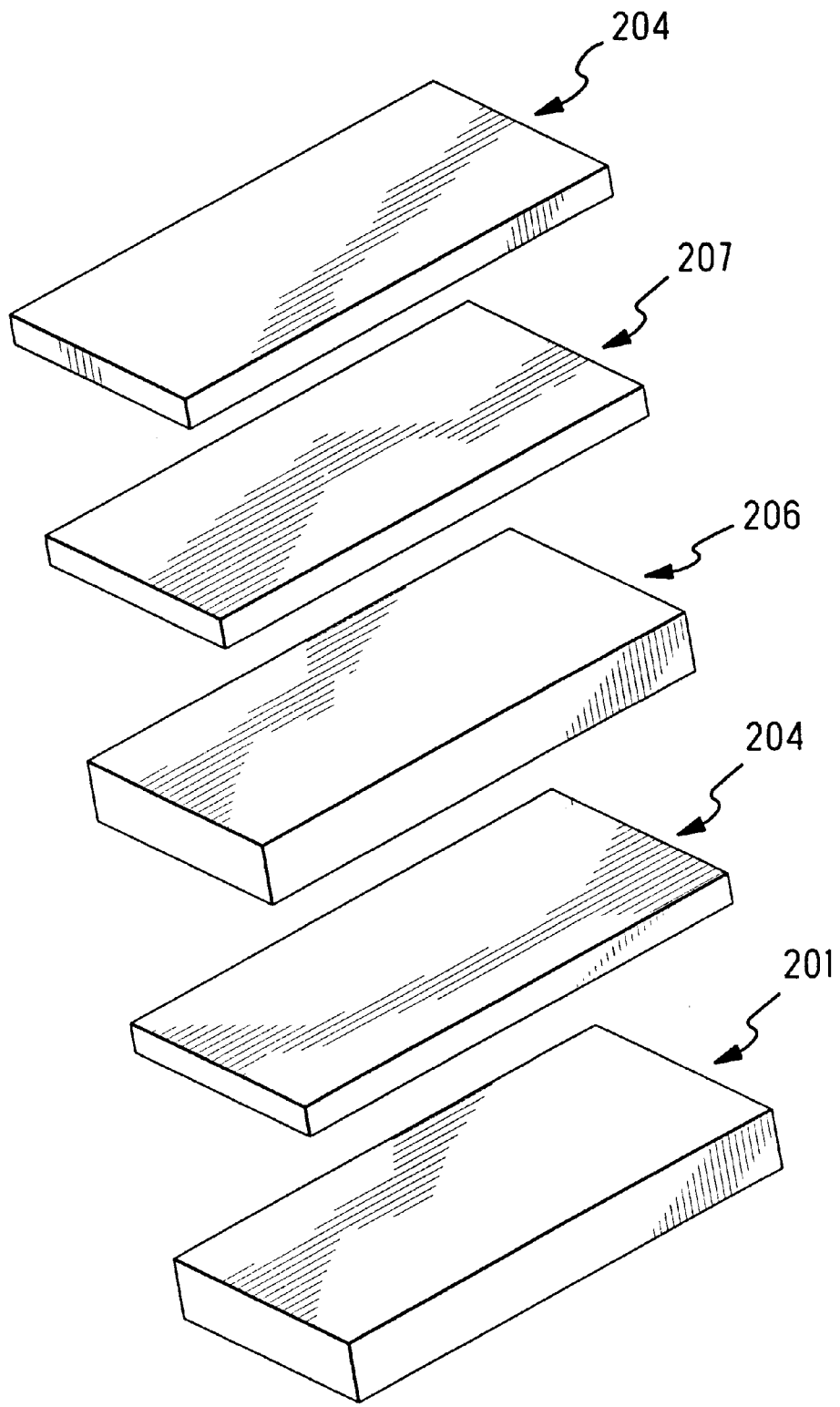

Turning to FIGS. 1, 2a and 2b, the structure of the array embodiment of the present disclosure is shown which is a part of the chip on flex transmitter VCSEL sub assembly. To this end, array layer 101, 201 has disposed thereon the VCSELs 102 of the array and the metallization 103 thereon. A layer of flex circuit 104, 204 is disposed thereon disposed having contact metallization as shown at 105. A glass substrate which is transparent to light from the VCSEL is shown at 107, 207, and has an amorphous silicon layer 106,206 the preferred material for the detector array deposited through standard technique thereon. The pn detectors of the array are shown at 109, with contact metallization as shown at 110. The contacts for the devices 102 and detectors 109 are for making necessary electrical connections via the flex circuitry 104. FIGS. 2a, 2b are embodiments of the invention with differing flex circuits 204 and the structures and utility of the flex circuits 204. FIG. 2a is the less complex version and is the exploded view of the device shown in FIG. 1.

The invention of the present disclosure makes use of optoelectronic properties of the amorphous silicon. The amorphous silicon is deposited on the glass by PECVD with doping achieved sequentially in the deposition process by well known techniques. The entire detector subassembly is obtained in final subassembly form from EG&G Optoelectronics of Sunnyvale, Calif. After the detector array subassembly is manufactured, it is incorporated into the VCSEL subassembly of the transmitter by chip on flex interconnection technology as described presently.

Figure 3:
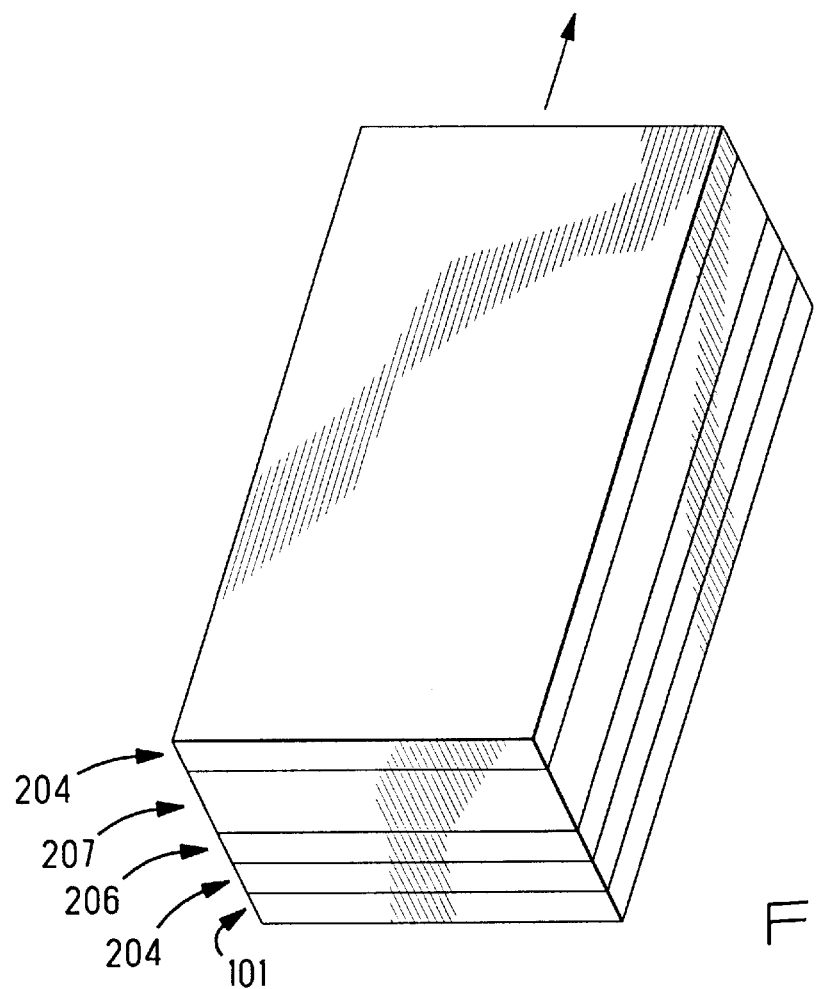
FIG. 3 is a perspective view of the array embodiment shown in exploded view in FIG. 2b.

The fabrication process to assemble the VCSEL and detector subassembly, and make the required electrical interconnections, uses multichip on flex and single-chip on flex interconnect technology. A standard single or double sided, pre-patterned flex circuit, (standard copper on polymide film) is used. Bare die are coated on top to cover entire surface including pads, and then flip chip bonded with an adhesive to the flex circuit. The flex circuit 104, 204 will have openings in the copper where the die are placed. This is typically done on a "wafer scale" held on a frame or carrier. The entire backside is then encapsulated with a glass filled resin, similar to the material all plastic encapsulated IC's are transfer molded with. The interconnection to the chip pads are formed by laser ablating through the polymide, down to the chip pad, where material ablation is self limited by the metal. Vias for electrical connection are also laser drilled to copper interconnects on the flex, if a multi-layer structure is used. The wafer is then placed in a vacuum chamber and titanium/copper is sputtered on. The wafer is then patterned using adaptive lithography to complete the interconnections from the chip pads, through any vias, and to the copper pads and lines. For the final metallization step, the top surface copper is gold plated. This gives an oxide free finish that is excellent for soldering, conductive epoxy, or wire bonding. For the final step, the wafer is diced up using a standard silicon dicing saw and procedure. Further details of this procedure can be found in U.S. Pat. Nos. 5,353,498 and 5,353,195 to Fillion, et al, the disclosures of which are specifically incorporated herein by reference. After the process of assembling the VCSEL and detector subassemblies is completed, the device of the present disclosure is as shown in FIG. 3. The flip-chip/chip-on-flex technology does not interfere with the optical transmission, because the kapton material is transparent at the wavelength range of operation. It is important to note that while the preferred embodiment of the present invention incorporates the pre-patterned flex circuit technology described above, this is not required. To this end, the detector array 106, 206 being non-integral with the surface emitting device array could be packaged in other ways to effect the monitoring/ detection of surface emitting device array.

As stated earlier, it is clear to one of ordinary skill in the art that while the preferred embodiment is a vertical cavity surface emitting laser array, this invention can be applied to a single device, as well as multiple devices in an array. Additionally, the materials used and particular devices used can be modified for different application. For example surface emitting light emitting diodes could be monitored in this fashion, and other surface emitting laser structures. Furthermore, while amorphous silicon is the preferred material for reasons disclosed herein, it is apparent to one of ordinary skill in the art that the use of gallium phosphide GaP based devices for the heterojunction it is using two materials to form a junction photodetection in an unbiased device could also be used. Furthermore an In GaAsP-junction devices can be used. It is of interest to note that the III–V devices lend themselves to other frequency ranges. Specifically, detectors that are semitransparent to wavelengths in the range of 1300–1550 nm can be fabricated in III–V devices. These devices are generally more expensive and more difficult to manufacture. Device processing is easier and cheaper in silicon based devices and epitaxial growth and fabrication techniques can be avoided through the use of silicon and not in the use of III–V based devices.

Figure 4:
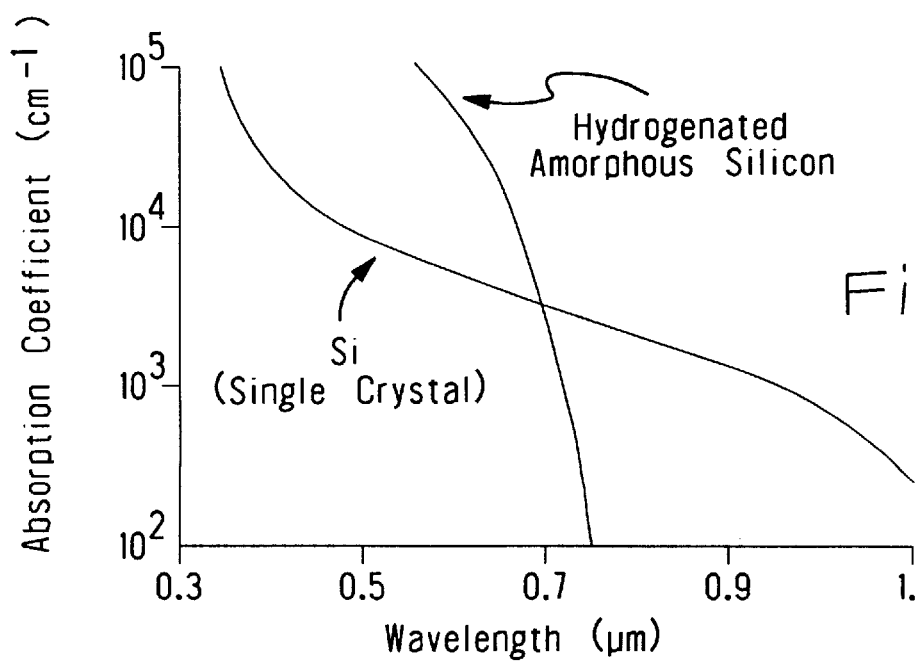
FIG. 4 is a graphical representation of the absorption coefficient, a, versus wavelength for single crystal silicon and amorphous silicon which has been hydrogenated.

FIG. 4 shows the plot of the absorption coefficient for hydrogenated amorphous silicon versus wavelength and compares this to the plot of single crystal silicon over a common wavelength range. As can be determined from FIG. 4, the photovoltaic response of amorphous silicon is relatively weak at 850 nanometers, but for the applications of a vertical cavity surface emitting laser with typical unattenuated output power on the order of a few milliwatts per element, enough photocurrent (on the order of 100 nanoamps) to enable creation of feedback control through a feedback control circuit. The amorphous silicon optical absorption spectrum is greatest in the visible spectrum extending into the near IR region just enough to be in the range of 850 nanometers, the preferred wavelength of the devices of the present disclosure. This property of the hydrogenated amorphous silicon material is exploited in the present invention. To this end, at the light transmission wavelength of the devices being monitored, most of the light will be transmitted through the layer of material in which the detectors are fabricated, with a small portion absorbed and converted into photocurrent for monitoring the output power of the devices. The hydrogenation allows the bonding of hydrogen with the dangling bonds in the silicon structure thereby reducing the optical absorption centers in silicon. This process allows for the sharp drop in the absorption edge in hydrogenated amorphous silicon In contrast, due to its indirect bandgap nature, crystalline silicon material enables absorption of photons with wavelengths above 850 nanometers as can be determined from FIG. 4. To be clear, while the preferred VCSEL wavelength is 850 nm, it is clear from FIG. 4 that the hydrogenated amorphous silicon would be semi-transparent at other wavelengths. The range of transmission wavelengths of the surface emitters that will work is from 780 nm to 900 nm, approximately.

The amorphous silicon material used in the preferred embodiment of the present disclosure does not allow for efficient absorption of photons with wavelengths in the range of 780 nm–900 nm, with the preferred wavelength being 850 nanometers. The optical absorption spectrum of hydrogenated amorphous silicon behaves as if the material were a direct bandgap 35 material with a bandgap energy of 1.6 eV as shown in FIG. 4). The detector structure consists of an n+ doped layer and a p+ doped layer in the amorphous silicon layer, with a rather thick layer (roughly 2–10 microns) of the hydrogenated amorphous silicon layer remaining undoped. The deposition and doping of the hydrogenated amorphous silicon being effected as described above. This structure is classified as a p/n junction structure as the undoped amorphous silicon layer being a depletion region. This could be classified as a PIN structure with the undoped layer being the intrinsic layer. In any event the structure is not biased, a clear benefit over the prior art. That is, in PIN structures, it is necessary to reverse bias the device to improve the response speed, responsivity and linearity. The linearity is at issue in most applications of PIN devices by virtue of the relatively large currents in the PIN detectors. The monitor detector is designed as an average power detector. The detectors of the present invention (which are semi-transparent at the wavelengths being emitted by the VCSEL's) operate at currents on the order of nanoamps, and the linearity issues are moot. Accordingly, the semi-transparent detector material at 780–900 nanometers is available through the use of the amorphous silicon. Finally, the glass substrate layer on which the amorphous silicon is deposited is transparent at 780–900 nanometers(95%), or depending on the glass material used and therefore is compatible for the preferred embodiment. This material can also be coated for attenuation and anti-reflection purposes needed to assure proper safety in the operation of the devices. The detectors 109 fabricated in the amorphous silicon layer 106 are supplied by EG&G Optoelectronics Corporation, Sunnyvale Calif. These detectors are generally used for power detection in the visible and x-ray frequency spectra, but, for reasons stated herein, their semi-transparent behavior at wavelengths on the order of 780–900 nm (preferably 850 nm) makes them particularly suitable for the present invention.

The monitoring circuitry (not shown) is a current to voltage amplifier (transimpedance amplifier) with very low frequency bandwidth. It converts the photocurrent detected by the detector and converts it to a voltage level which by proper amplifier circuit design can be set enough to allow the driver circuitry to adjust its laser diode bias current.

The semi-transparent detector array of the invention of the present disclosure can alternatively be used as an optical power attenuator. In order to comply with safety issues, the optical transmitter has to meet standard eye safety regulations. Therefore, the output power of the vertical cavity surface emitting lasers must be controlled. However, due to the device characteristics, the laser has to be biased above the threshold and operated at relatively high output power levels in order to meet the extinction ratio and bandwidth requirements due to VCSEL's "turn on delay" problems. Therefore, the laser transmitter by itself is unable to meet the eye safety and performance requirements simultaneously. The detector array can be tailored to attenuate the optical output power level of the vertical cavity laser through its active layer or by coating its substrate by metal vapor deposition and thereby making it a neutral density filter as well as a monitor detector. The optical power available from the laser and the required optical power level available for fiber optic data link operations allows for a very poor detector efficiency, as low as 0.001 amps per watt at 850 nanometers. Additionally, the constant feedback control circuit does not require a large signal for operation. Therefore, the use of the readily fabricated and simple semi-transparent detector array solves a number of problems at the same time. In comparison with alternative techniques which rely on reflectives/refractive optics or integral structures, the detector array is superior through its simplicity because it is an external power detector in the path of the fiber or waveguide and therefore not sensitive beam shape/mode variations/and spontaneous emission of the lasers. Finally, packaging of such a device is relatively straight forward and compatible with the chip on flex technique and other planar assembly/interconnection methods which are required for managing the tight tolerance in component alignment and assembly required in array transmitter fabrication. The glass structure of the monitor detector is also thermally compatible with the chip on flex technology, eliminating the problems of thermal expansion mismatches found with other materials.

The invention having been described in detail, it is clear that modification and variations of the disclosure of the present invention are within the purview of one of ordinary skill in the art. To the extent that these modifications are within the scope of a relatively simple unbiased detector array for monitoring output power through the direct link of the surface emitting light emitting devices to the semi-transparent detector is within the purview of one of ordinary skill in the art, such are deemed within the scope of the present invention.

We claim:

1. Apparatus for monitoring emissions from vertical cavity surface emitting lasers, VCSELs, comprising: an amorphous silicon layer on a glass substrate, the amorphous silicon layer having selectively doped areas that provide PN junctions of photovoltaic devices, the amorphous silicon having a sufficiently small optical absorption coefficient, within an optical wavelength range, that limits absorption by the amorphous silicon layer of a corresponding small fractional amount of light being emitted by the VCSELs, the amorphous silicon layer and the glass substrate being sufficiently thin to be transmissive of such light therethrough, excluding said small fractional amount of such light being absorbed, and a separate substrate having selected areas being provided with the VCSELs, the photovoltaic devices being on top of the VCSELs, the VCSELs being further constructed and arranged to emit such light having a wavelength range that corresponds to the wavelength range at which the amorphous silicon has said sufficiently small absorption coefficient, whereby, a substantial portion of such light is transmitted through the photovoltaic devices, and a small fraction of such light is absorbed by the doped areas of the amorphous silicon layer to produce photovoltaic currents from said photovoltaic devices as a measurement of output power of said VCSELs.

2. Apparatus as recited in claim 1 wherein, the glass substrate is over the separate substrate to position the photovoltaic devices along the axes of light emission for the VCSELs.

3. Apparatus as recited in claim 1 wherein, the VCSELs have area geometries that match the area geometries of the selectively doped areas of the amorphous silicon layer, such that the photovoltaic devices cover the VCSELs.

4. Apparatus as recited in claim 1 wherein, the separate substrate is a silicon wafer on which the VCSELs are formed.

5. Apparatus as recited in claim 1 wherein, the VCSELs emit light in the wavelength range 780–900 nm that corresponds to the wavelength range at which the amorphous silicon layer has said sufficiently small optical absorption coefficient.

6. Apparatus as recited in claim 1 wherein, the VCSELs are at a top surface of the separate substrate, and the photovoltaic devices are at a bottom surface of the amorphous silicon layer that faces toward the VCSELs.

7. Apparatus as recited in claim 1 wherein, the amorphous silicon layer is on a bottom surface of the glass substrate, and the photovoltaic devices are at a bottom surface of the amorphous silicon layer that faces toward the VCSELs.

8. Apparatus as recited in claim 1 and further comprising: areas of semitransparent contact metallization on a transparent flex circuit layer, the amorphous silicon layer having semitransparent contact metallization areas being in contact with some of the areas of semitransparent contact metallization on the transparent flex circuit layer, and the separate substrate having respective semitransparent contact metallization areas being in contact with further areas of semitransparent contact metallization on the transparent flex circuit layer.

9. Apparatus as recited in claim 8 wherein, the transparent flex circuit layer is between the amorphous silicon layer and the separate substrate.

10. Apparatus as recited in claim 8 wherein, the glass substrate is over the separate substrate to position the photovoltaic devices along the axes of light emission for the VCSELs.

11. Apparatus as recited in claim 8 wherein, the VCSELs have area geometries that match the area geometries of the selectively doped areas of the amorphous silicon layer, such that the photovoltaic devices cover the VCSELs.

12. Apparatus as recited in claim 8 wherein, the separate substrate is a silicon wafer on which the VCSELs are formed.

13. Apparatus as recited in claim 8 wherein, the VCSELs emit light in the wavelength range 780–900 nm that corresponds to the wavelength range at which the amorphous silicon layer has said sufficiently small optical absorption coefficient.

14. Apparatus as recited in claim 8 wherein, the VCSELs are at a top surface of the separate substrate, and the photovoltaic devices are at a bottom surface of the amorphous silicon layer that faces toward the VCSELs.

15. Apparatus as recited in claim 8 wherein, the amorphous silicon layer is on a bottom surface of the glass substrate, and the photovoltaic devices are at a bottom surface of the amorphous silicon layer that faces toward the VCSELs.

* * * * *